United States Patent
Cheng et al.

(10) Patent No.: US 10,615,355 B2
(45) Date of Patent: Apr. 7, 2020

(54) ORGANIC LIGHT-EMITTING DISPLAY PANEL AND DISPLAY DEVICE

(71) Applicant: Shanghai Tianma AM-OLED Co., Ltd., Shanghai (CN)

(72) Inventors: Shuang Cheng, Shanghai (CN); Xiangcheng Wang, Shanghai (CN); Jinghua Niu, Shanghai (CN); Qing Zhu, Shanghai (CN); Zhi Zhang, Shanghai (CN); Jianyun Wang, Shanghai (CN); Jun Lin, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/136,711

(22) Filed: Sep. 20, 2018

(65) Prior Publication Data
US 2019/0372042 A1 Dec. 5, 2019

(30) Foreign Application Priority Data

May 31, 2018 (CN) .......................... 2018 1 0552680

(51) Int. Cl.
*H01L 51/50* (2006.01)
*H01L 27/12* (2006.01)
(52) U.S. Cl.
CPC ........ *H01L 51/5004* (2013.01); *H01L 51/508* (2013.01); *H01L 51/5036* (2013.01); *H01L 51/5076* (2013.01); *H01L 27/1214* (2013.01)
(58) Field of Classification Search
None
See application file for complete search history.

(56) References Cited

U.S. PATENT DOCUMENTS

| 2016/0224144 | A1* | 8/2016 | Klinghult | G06F 3/0428 |
| 2017/0117480 | A1* | 4/2017 | Oh | H01L 51/0058 |
| 2018/0337341 | A1* | 11/2018 | Heo | C07D 311/78 |

FOREIGN PATENT DOCUMENTS

| CN | 103594659 A | 2/2014 |
| CN | 106601921 A | 4/2017 |
| CN | 106784355 A | 5/2017 |

OTHER PUBLICATIONS

Chinese Office Action dated May 30, 2019 for corresponding Chinese Patent Application No. 201710403709X.

* cited by examiner

*Primary Examiner* — Jay C Chang
(74) *Attorney, Agent, or Firm* — Tarolli, Sundheim, Covell & Tummino LLP

(57) ABSTRACT

Organic light-emitting display panel and device are provided for improving performance of the organic light-emitting device. The organic functional layer comprises an organic light-emitting layer and a first electron transmission layer between the cathode and the organic light-emitting layer. The first electron transmission layer comprises a first doping agent, and the first doping agent contains alkaline earth metal elements or rare earth metal elements. A second electron transmission layer is located between the first electron transmission layer and the organic light-emitting layer, and the second electron transmission layer is undoped with the first doping agent. A lowest unoccupied molecular orbital LUMO1 in the first electron transmission layer and a lowest unoccupied molecular orbital LUMO2 in the second electron transmission layer satisfy: |LUMO1−LUMO2|<0.18 eV. A highest occupied molecular orbital HOMO2 in the second electron transmission layer and a highest occupied molecular orbital HOMO3 of the organic light-emitting layer satisfy: |HOMO2−HOMO3|<1 eV.

19 Claims, 5 Drawing Sheets

ORGANIC LIGHT-EMITTING DISPLAY PANEL AND DISPLAY DEVICE

CROSS-REFERENCE TO RELATED APPLICATIONS

The present application claims the benefit of priority to Chinese Patent Application No. 201810552680.6, filed on May 31, 2018, the content of which is incorporated herein by reference in its entirety.

TECHNICAL FIELD

The present disclosure relates to the field of display technologies and, in particular, to an organic light-emitting display panel and a display device.

BACKGROUND

In recent years, with the development of the display technologies, various kinds of display devices have been pushed into the market. For example, liquid crystal display device, organic light-emitting display device and the like have already become the leading products in the current display industry, in which the organic light-emitting display panel is the dominant trend of the display industry due to its excellent characteristics of light and thin, low power consumption, high brightness, high contrast, high definition, wide angle of view etc., and is the hot spot of researching in the display field.

One of the most important components of the organic light-emitting display panel is the organic light-emitting diode. The organic light-emitting diode emits light through the light-emitting layer between the anode and the cathode under driven of the electric field applied between the anode and the cathode. In a conventional organic light-emitting diode, since the hole mobility is generally higher than the electron mobility, the recombination center of the holes and the electrons will deviate from the light-emitting layer, resulting in that the luminous efficiency of the light-emitting layer decreases. Therefore, how to improve the electron mobility and further balance the mobility of the holes and the electrons in the organic light-emitting diode so that their recombination center will not deviate, without affecting the luminous efficiency of the OLED, is the most urgent problem to be solved.

SUMMARY

In view of the above, embodiments of the present disclosure provide an organic light-emitting display panel and a display device, for improving the performance of the organic light-emitting component.

In an aspect, embodiments of the present disclosure provide an organic light-emitting display panel, including:

an array substrate including a plurality of driving elements;

a plurality of organic light-emitting components corresponding to the plurality of driving elements, wherein the organic light-emitting components each have an anode, a cathode and an organic functional layer between the anode and the cathode, wherein the organic functional layer includes an organic light-emitting layer and a first electron transmission layer between the cathode and the organic light-emitting layer, wherein the first electron transmission layer includes a first doping agent, and the first doping agent contains alkaline earth metal elements or rare earth metal elements;

wherein the organic light-emitting component further includes a second electron transmission layer located between the first electron transmission layer and the organic light-emitting layer, and the second electron transmission layer is undoped with the first doping agent; wherein a lowest unoccupied molecular orbital $LUMO_1$ of an electron transmission matrix in the first electron transmission layer and a lowest unoccupied molecular orbital $LUMO_2$ of an electron transmission matrix in the second electron transmission layer satisfy: $|LUMO_1-LUMO_2|<0.18$ eV;

a highest occupied molecular orbital $HOMO_2$ of the electron transmission matrix in the second electron transmission layer and a highest occupied molecular orbital $HOMO_3$ of a host material of the organic light-emitting layer satisfy: $|HOMO_2-HOMO_3|<1$ eV, and in at least one of the organic light-emitting components, the highest occupied molecular orbital $HOMO_2$ of the electron transmission matrix in the second electron transmission layer and the highest occupied molecular orbital $HOMO_3$ of the host material of the organic light-emitting layer satisfy: $|HOMO_2-HOMO_3|>0.2$ eV.

In another aspect, embodiments of the present disclosure provide an organic light-emitting display device, including the above organic light-emitting display panel.

The above aspects and it any implementing manner can have the following beneficial effects:

In the present disclosure, the first electron transmission layer is arranged between the cathode and the organic light-emitting layer, the first electron transmission layer includes the first doping agent, and the first doping agent includes alkaline earth metal elements or rare earth metal elements, therefore the transmission rate of the electrons generated by the cathode transmitting to the organic light-emitting layer can be increased. Moreover, a second electron transmission layer is arranged between the first electron transmission layer and the organic light-emitting layer, since the second electron transmission layer does not contain the first doping agent, thus will not absorb the photons generated by the recombination of the electrons and the holes, so that the luminous efficiency of the organic light-emitting display panel can be guaranteed. Further, when a negative voltage is applied to the cathode, the electrons overcome the potential barrier and are migrated towards lower energy level until to the organic light-emitting layer. In the present embodiment, the lowest unoccupied molecular orbital $LUMO_1$ of the electron transmission matrix in the first electron transmission layer and the lowest unoccupied molecular orbital $LUMO_2$ of the electron transmission matrix in the second electron transmission layer satisfy: $|HOMO_1-HOMO_2|<0.18$ eV, the energy level difference is small, since the electron carriers are migrated to the organic light-emitting layer, the mobility of the electron is improved. In this case, some holes may also overcome the potential barrier and be migrated towards high energy level, in the present embodiment, the highest occupied molecular orbital $HOMO_2$ of the electron transmission matrix in the second electron transmission layer and the highest occupied molecular orbital $HOMO_3$ of the host material of the organic light-emitting layer satisfy: $|HOMO_2-HOMO_3|<1$ eV, and in at least one organic light-emitting component, highest occupied molecular orbital $HOMO_2$ of the electron transmission matrix in the second electron transmission layer and the highest occupied molecular orbital $HOMO_3$ of the host material of the organic light-emitting layer satisfy:

|HOMO2−HOMO3|>0.2 eV, so as to prevent the holes moving from the light-emitting layer to the hole blocking layer, and to reduce the transfer of excitons in the light-emitting layer to the hole transmission layer.

BRIEF DESCRIPTION OF DRAWINGS

In order to illustrate technical solutions of embodiments of the present disclosure or the related art more clearly, the accompanying drawings used in the embodiments or the related art will be briefly introduced hereinafter. Obviously, the drawings described are only some of the embodiments of the present disclosure, on the basis of these drawings, those of ordinary skill in the art can also obtain other drawings without creative efforts.

DESCRIPTION OF EMBODIMENTS

Figure 1:
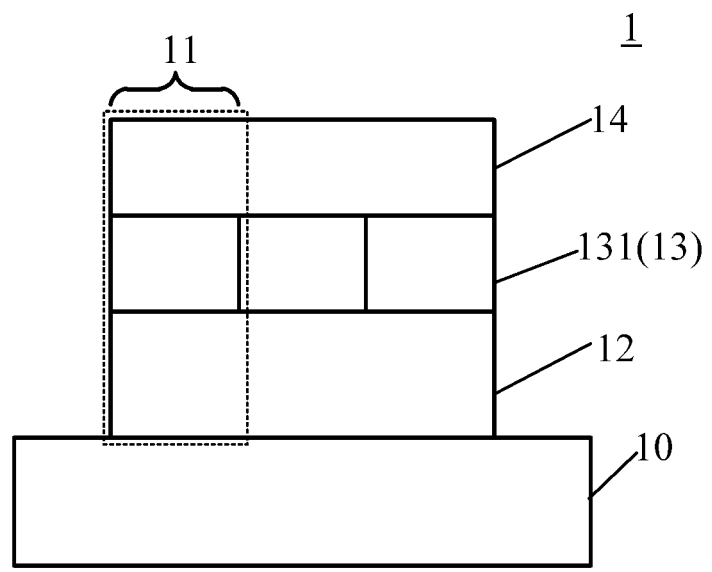
FIG. 1 illustrates a schematic structural diagram of an organic light-emitting display panel according to an embodiment of the present disclosure.

In order to make objects, technical solutions and advantages of the present disclosure more clearly, the technical solutions in the embodiments of the present disclosure will be described clearly and completely with reference to the drawings in the embodiments of the present disclosure. Obviously, the described embodiments are only part of the embodiments, rather than all of them. Based on the embodiments of the present disclosure, any other embodiments obtained by those of ordinary skill in the art shall fall in the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless otherwise clearly noted in the context.

It should be understood that, the term "and/or" used in the present disclosure merely refers to a relation between associated objects, that is, including three types of relations. For example, A and/or B refers to: (a) A exists alone; (b) A and B exist at the same time; or (c) B exists alone. In addition, the character "/" generally refers to an "or" relation.

It should be understood that, although expressions "first", "second", "third" etc. are used to describe specific electron transmission layers, they shall not be interpreted as limiting the specific electron transmission layers. These expressions are merely used to distinguish among the specific electron transmission layers. For example, without departing from the scope of the present disclosure, a first electron transmission layer can also be named as a second electron transmission layer, and vice versa.

It should be noted that, the term indicating locations such as "above", "below", "left", "right" as illustrated according to the view shown in the drawings, which shall not be interpreted as limitations to the present disclosure. In addition, in the context, it should be noted that, when an element is formed "above" or "below" another element, the element can be directly formed "above" or "below" the other element, or can be indirectly formed "above" or "below" the other element through an intervening element.

Before illustrating embodiments of the present disclosure, the structure of the organic light-emitting display panel related and the sequence of thought during its research and development are briefly introduced as follows:

As shown in FIG. 1, FIG. 1 illustrates a schematic structural diagram of an organic light-emitting display panel according to an embodiment of the present disclosure. The organic light-emitting display panel 1 includes an array substrate 10, and the array substrate 10 includes a plurality of driving elements (not shown in the figure). The organic light-emitting display panel 1 further includes an anode 12, a cathode 14 and an organic functional layer 13 between the anode 12 and the cathode 14.

It should be understood that, the anode 12 contacts with a side surface of the array substrate 10, and the cathode 14 is located at a side surface of the organic functional layer 13 facing away from the array substrate 10. The array substrate 10 in the present embodiment can be a flexible substrate, the corresponding organic light-emitting display panel 1 can be a flexible organic light-emitting display panel. The flexible organic light-emitting display panel has characteristics of low power consumption and is bendable, thus is applicable to various kinds of display devices, especially to wearable display devices. Optionally, the material of the flexible substrate is polyesterimide or polyethylene terephthalate resin. In addition, the array substrate can also be a rigid substrate and, correspondingly, the organic light-emitting display panel 1 can be a rigid organic light-emitting display panel. In fact, the present disclosure does not specifically limit the material of the organic light-emitting display panel.

In the present embodiment, during the electroluminescence process, the anode 12 is applied with a positive voltage. In the present embodiment, the material of the anode 12 can be indium tin oxide. The anode 12 at least includes a reflective film located at a side surface of the anode 12 facing away from the array substrate 10, and the reflective film can be made of silver. The anode 12 can further include a transparent conductive thin film located at a side surface of the reflective film facing away from the array substrate 10, and the transparent conductive thin film can be made of indium tin oxide or indium zinc oxide.

In the present embodiment, during the electroluminescence process, the cathode 14 is applied with a negative voltage. In order to improve the capacity of injecting the electron carrier from the cathode 14 into the organic functional layer 13, the cathode 14 can be made of materials such as Ag, Al, Ca, In, Li, Mg and the like which are metal materials or composite metal materials having low work function.

Further, in order to reduce the injection barrier and increase the mobility of the electron carrier, a side of the cathode 14 close to the organic functional layer 13 can contain rare earth metal elements or alkaline earth metal elements.

However, after the rare earth metal elements or alkaline earth metal elements are added, local content percentage of the rare earth metal elements or alkaline earth metal elements is high, which may easily disperse to the organic light-emitting layer of the organic functional layer. Moreover, a part of the rare earth metal elements or alkaline earth metal elements has high extinction coefficient, so that the photons generated by recombination of the electrons and the holes may be absorbed by these elements, thus the luminous efficiency may decrease.

In order to solve the above problem, the side of the cathode close to the organic functional layer may not be doped with the rare earth metal elements or alkaline earth metal elements. However, the original problem in improving the electron mobility of the OLED display panel is still not solved.

Figure 2:
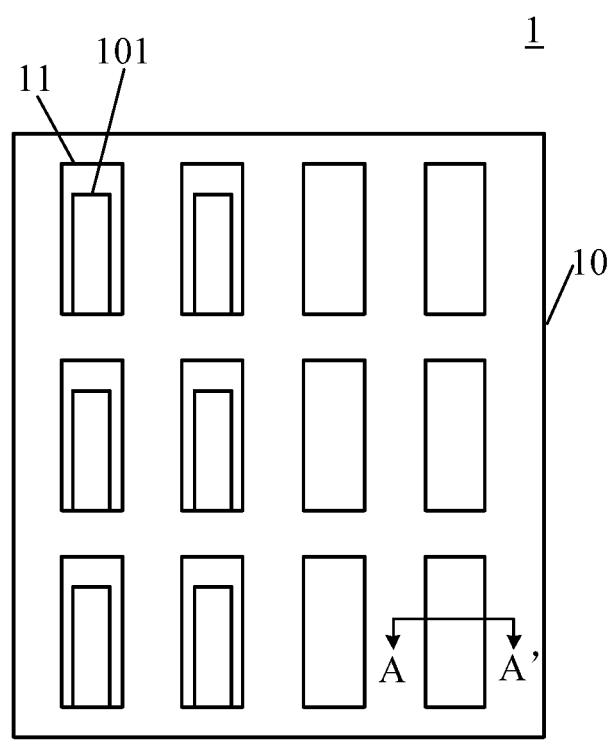
FIG. 2 illustrates another schematic structural diagram of an organic light-emitting display panel according to an embodiment of the present disclosure.
Figure 3:
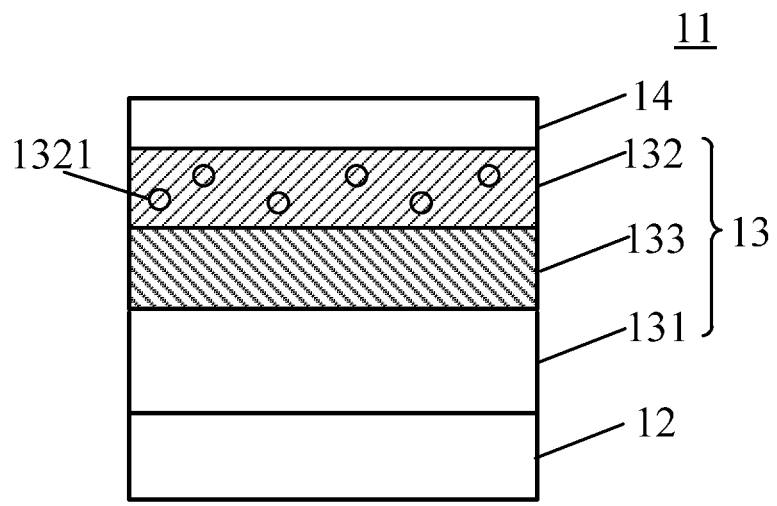
FIG. 3 illustrates a cross-sectional view of an organic light-emitting component in FIG. 2 along AA' line according to an embodiment of the present disclosure.

In order to achieve the purpose of increasing the electron mobility and, at the same time, not to affect the luminous efficiency of the OLED, the inventor has provided the following technical solution:

The present disclosure provides an organic light-emitting display panel, as shown in FIG. 2 and FIG. 3. FIG. 2 illustrates another schematic structural diagram of an organic light-emitting display panel according to an embodiment of the present disclosure, and FIG. 3 illustrates a cross-sectional view of the organic light-emitting component in FIG. 2 along AA' line according to an embodiment of the present disclosure. As shown in FIG. 2, the organic light-emitting display panel 1 includes an array substrate 10, and the array substrate 10 includes a plurality of driving elements 101. In order to show the relation between the driving element and the organic light-emitting component, the transparency of the organic light-emitting component in FIG. 2 is set as 60%, so that the driving element 101 covered by the organic light-emitting component can be viewed.

Please refer to FIG. 3, the organic light-emitting display panel 1 further includes an organic light-emitting component 11 arranged corresponding to the driving element 101. The organic light-emitting component 11 includes an anode 12, a cathode 14 and an organic functional layer 13 between the anode 12 and the cathode 14. The organic functional layer 13 includes an organic light-emitting layer 131 and a first electron transmission layer 132 between the cathode 14 and the organic light-emitting layer 131. The first electron transmission layer 132 includes a first doping agent 1321, and the first doping agent 1321 includes alkaline earth metal elements or rare earth metal elements.

As shown in FIG. 3, the organic light-emitting component 11 further includes a second electron transmission layer 133 located between the first electron transmission layer 132 and the organic light-emitting layer 131. The second electron transmission 133 does not contain the first doping agent 1321. The lowest unoccupied molecular orbital LUMO1 of the electron transmission matrix in the first electron transmission layer 132 and the lowest unoccupied molecular orbital LUMO2 of the electron transmission matrix in the second electron transmission layer 133 satisfy: |LUMO1−LUMO2|<0.18 eV. The highest occupied molecular orbital HOMO2 of the electron transmission matrix in the second electron transmission layer 133 and the highest occupied molecular orbital HOMO3 of the host material of the organic light-emitting layer 131 satisfy: |HOMO2−HUMO3|<1 eV. In at least one organic light-emitting component, the highest occupied molecular orbital HOMO2 of the electron transmission matrix in the second electron transmission layer 133 and the highest occupied molecular orbital HOMO3 of the host material of the organic light-emitting layer 131 satisfy: |HOMO2−HOMO3|<0.2 eV.

In the present embodiment, the first electron transmission layer 132 is arranged between the cathode 14 and the organic light-emitting layer 131, the first electron transmission layer 132 includes the first doping agent 1321, and the first doping agent 1321 includes alkaline earth metal elements or rare earth metal elements. Therefore the mobility of the electrons generated by the cathode 14 migrating to the organic light-emitting layer 131 can be increased. Moreover, a second electron transmission layer 133 is arranged between the first electron transmission layer 132 and the organic light-emitting layer 131. Since the second electron transmission layer 133 does not contain the first doping agent 1321 so that the first doping agent 1321 would be avoided effectively to be dispersed into the organic light-emitting layer 131, the photons generated by the recombination of the electrons and the holes would be not absorbed, so that the luminous efficiency of the organic light-emitting display panel can be guaranteed. Further, when a negative voltage is applied to the cathode, the electrons overcome the potential barrier and are migrated towards lower energy level until reaching the organic light-emitting layer. In the present embodiment, the lowest unoccupied molecular orbital LUMO1 of the electron transmission matrix in the first electron transmission layer 132 and the lowest unoccupied molecular orbital LUMO2 of the electron transmission matrix in the second electron transmission layer 133 satisfy: |LUMO1−LUMO2|<0.18 eV, the unoccupied orbital energy level difference therebetween is small. Therefore, the electron carriers are migrated to the organic light-emitting layer, so that the mobility of the electron is improved. In this case, some holes may also overcome the potential barrier and be migrated towards high energy level. In the present embodiment, the highest occupied molecular orbital HOMO2 of the electron transmission matrix in the second electron transmission layer 133 and the highest occupied molecular orbital HOMO3 of the host material of the organic light-emitting layer 131 satisfy: |HOMO2−HOMO3|<1 eV, and in at least one organic light-emitting component, the highest occupied molecular orbital HOMO2 of the electron transmission matrix in the second electron transmission layer 133 and the highest occupied molecular orbital HOMO3 of the host material of the organic light-emitting layer 131 satisfy: |HOMO2−HOMO3|>0.2 eV, so as to prevent the red light and green light moving from the light-emitting layer to the hole blocking layer. Preferably, in the organic light-emitting component emitting red light and the organic light-emitting component emitting green light, |HOMO2−HOMO3|>0.2 eV, so as to prevent the red light and green light moving from the light-emitting layer to the hole blocking layer, and to reduce the transfer of excitons in the light-emitting layers emitting red light, green light and blue light to the hole transmission layer.

Figure 4:
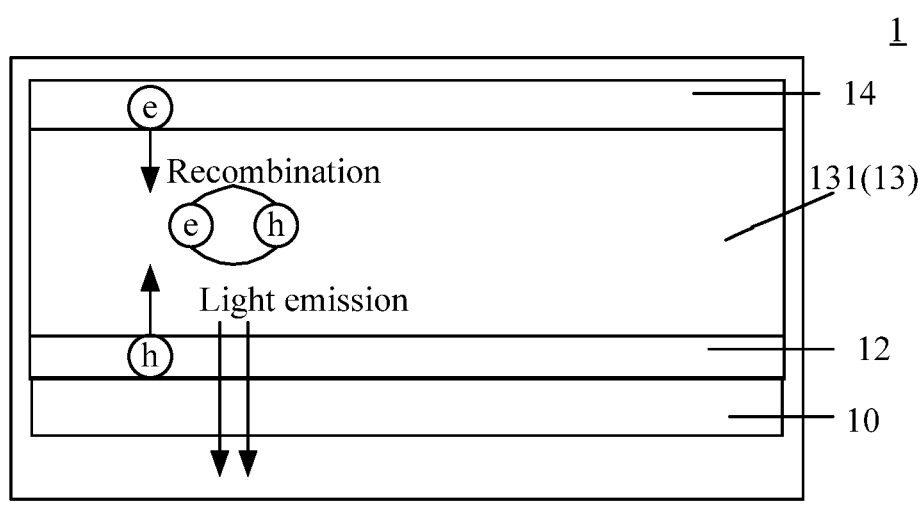
FIG. 4 illustrates another cross-sectional view of the organic light-emitting component in FIG. 2 along AA' line according to an embodiment of the present disclosure.

The luminous principle of the organic light-emitting component in the organic light-emitting display panel is briefly introduced as follows:

As shown in FIG. 4, FIG. 4 illustrates a principal schematic view of the organic light-emitting display panel according to an embodiment of the present disclosure. Under the external electric field, an electron e is injected from the cathode 14 to the organic functional layer 13, and a hole h is injected from the anode 12 to the organic functional layer 13. The injected electron e and hole h are recombined in the organic light-emitting layer 131 to generate an exciton. The exciton migrates under the effect of the electric field, and transfers the energy to the organic light-emitting molecular in the organic light-emitting layer 131. The electron of the organic light-emitting molecular jumps from the ground state to the excited state and releases energy, and then the energy is released in the form of photon to emit light.

In an embodiment, the highest occupied molecular orbital HOMO1 of the electron transmission matrix in the first electron transmission layer 132 and the highest occupied molecular orbital HOMO2 of the electron transmission matrix in the second electron transmission layer 133 satisfy: 0<|HOMO1−HOMO2|<0.8 eV. For the hole carrier, since the highest occupied orbital energy level difference is small, it is guaranteed that they can effectively block the energy level of the hole which is far from the light-emitting layer.

In an embodiment, the lowest unoccupied molecular orbital LUMO2 of the electron transmission matrix in the second electron transmission layer 133 and the lowest unoccupied molecular orbital LUMO3 of the electron transmission matrix in the organic light-emitting layer 131 satisfy: |LUMO2−LUMO3|<0.8 eV.

In the present embodiment, for the electron carrier, since the lowest unoccupied orbital energy level difference is low, it is beneficial for the electron carrier to migrate from the first electron transmission layer 132 to the second electron transmission layer 133 and, at the same time, the injection efficiency of the electron carrier is improved.

Moreover, during the jumping process of the electron, the higher the crossed energy level jumped, the easier the electron can be gathered at the interface. In the present embodiment, if the lowest unoccupied molecular orbital LUMO2 of the electron transmission matrix in the second electron transmission layer 133 and the lowest unoccupied molecular orbital LUMO3 of the electron transmission matrix in the organic light-emitting layer 131 satisfy the above relation, it is preferred to set an intermediate energy level, so that the electron easily jumps and will not gather at the interface, which may improve the injection efficiency of the electron on one hand and, increase the response speed of the organic light-emitting component on the other hand.

Figure 5:
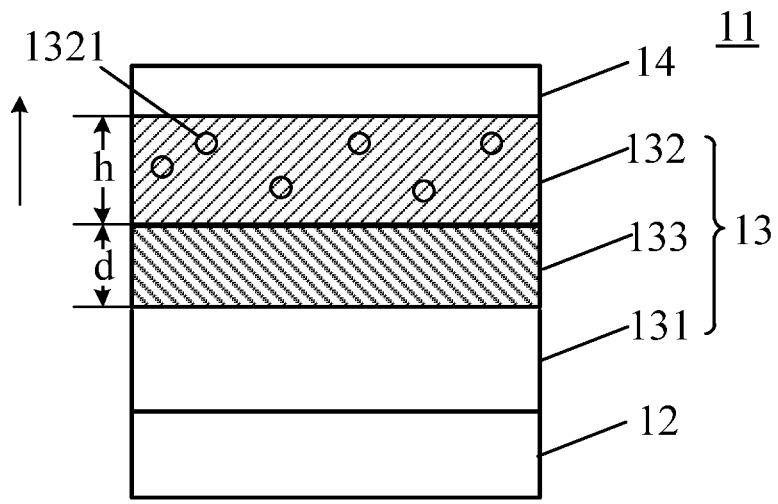
FIG. 5 illustrates still another cross-sectional view of the organic light-emitting component in FIG. 2 along AA' line according to an embodiment of the present disclosure.

In an embodiment, as shown in FIG. 5, FIG. 5 illustrates still another cross-sectional view of the organic light-emitting component in FIG. 2 along AA' line according to an embodiment of the present disclosure. The thickness d of the second electron transmission layer 133 is in a range of: 2 nm<d<60 nm. From the above embodiments, the second electron transmission layer 133 can, on one hand, block the first doping agent 1321 to prevent the adverse effect if the first doping agent 1321 disperses to the organic light-emitting layer 131 and, on the other hand, since the highest occupied orbital energy level difference between the second electron transmission layer 133 and the first electron transmission layer 132 is small, it can block the hole carrier from migration. In order to achieve the above purpose, the thickness d of the second electron transmission layer 133 in a direction (the direction shown by the arrow in FIG. 5) perpendicular to the organic light-emitting display panel 1 shall not be set too small, for example, not smaller than 2 nm, since a too small thickness cannot sufficiently block the first doping agent 1321. Moreover, the thickness d shall not be set too large, for example no larger than 60 nm, since a too large thickness is adverse to the injection of the electron carrier, which may influence the mobility of the electron carrier.

In an embodiment, as shown in FIG. 5, the thickness h of the first electron transmission layer 132 is larger than the thickness d of the second electron transmission layer 133. Since the first electron transmission layer 132 includes a first doping agent 1321, the first electron transmission layer 132 with a relative large thickness can be matched with the dispersion range of the first doping agent 1321, so as to avoid the first doping agent 1321 from dispersing into the second electron transmission layer 133, thereby preventing the influence of the first doping agent 1321 on the organic light-emitting layer 131.

In an embodiment, the doping volume ratio of the first doping agent 1321 in the first electron transmission layer 132 is in a range of 0.5%-7%. The larger the volume ratio of the first doping agent 1321 in the first electron transmission layer 132, the faster the mobility of the electron carrier. However, considering that the first doping agent 1321 includes alkaline earth metal elements or rare earth metal elements, the light transmittance of the first electron transmission layer 132 may be influenced, therefore, the mobility of the electron carrier and the light transmittance of the first electron transmission layer 132 shall be balanced. In the present embodiment, the volume ratio of the first doping agent 1321 in the first electron transmission layer 132 is set. When the doping volume ratio of the first doping agent 1321 in the first electron transmission layer 132 is smaller than 0.5%, the mobility of the electron carrier will be influence; and when the doping volume ratio of the first doping agent 1321 in the first electron transmission layer 132 is larger than 7%, the light transmittance of the first electron transmission layer 132 will be reduced, thereby affecting the emergent light amount of the organic light-emitting display panel 1. For example, when the doping volume ratio of the first doping agent 1321 in the first electron transmission layer 132 is in a range of 0.5%-7%, the light transmittance of the first electron transmission layer 13 is larger than 65%.

In an embodiment, the electron mobility Em and the hole mobility Hm in the second electron transmission layer 133 satisfy: Em>Hm*100. That is to say, in the second electron transmission layer 133, the electron mobility is much larger than the hole mobility, therefore, it can be interpreted as: the second electron transmission layer 133 inhibits the migration of the hole carrier, and improves the injection capacity of the electron carrier from the second electron transmission layer 133 to the organic light-emitting layer 131.

In an embodiment, the material of the electron transmission matrix in the first electron transmission layer 133 is the same as the material of the electron transmission matrix in the first electron transmission layer 132.

For example, the material of both the electron transmission matrix of the first electron transmission layer 132 and the electron transmission matrix of the second electron transmission layer 133 can be dipyridyl, triazine ring, lithium quinoline and the like.

When the materials of both the electron transmission matrix of the first electron transmission layer 132 and the electron transmission matrix of the second electron transmission layer 133 are the same, on one hand, the injection barrier is the same and, on the other hand, the cost can be lowered.

In another embodiment, the material of the electron transmission matrix in the second electron transmission layer 133 is different from the material of the electron transmission matrix in the first electron transmission layer 132.

For example, with reference to the above embodiments, the material of the electron transmission matrix of the first electron transmission layer 132 can be dipyridyl, triazine ring, lithium quinoline and the like, and the material of the electron transmission matrix of the second electron transmission layer 133 can be carbazole material, thiophene material, scepter material or spiro material etc.

It should be understood that, in the present embodiment, since the electron transmission matrix of the first electron transmission layer 132 is different from the electron transmission matrix of the second electron transmission layer 133, the second electron transmission layer 133 can be interpreted as a hole blocking layer, therefore, on one hand, the mobility of the electron carrier can be increased and, on the other hand, the migration of the hole carrier can be inhibited, thereby preventing the electron carrier and the hole carrier from recombining at the second electron transmission layer 133 due to accumulation.

Figure 6:
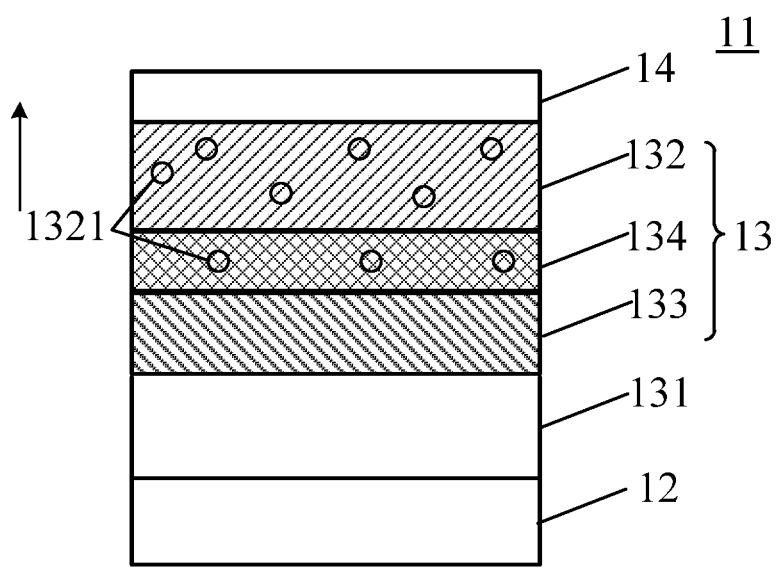
FIG. 6 illustrates still another cross-sectional view of the organic light-emitting component in FIG. 2 along AA' line according to an embodiment of the present disclosure.

In an embodiment, as shown in FIG. 6, FIG. 6 illustrates still another cross-sectional view of the organic light-emitting component in FIG. 2 along AA' line according to an embodiment of the present disclosure. The organic light-emitting component 11 further includes a third electron transmission layer 134 located between the first electron transmission layer 132 and the second electron transmission layer 133. The doping concentration of the first doping agent 1321 in the third electron transmission layer 134 is less than the doping concentration of the first doping agent 1321 in the first electron transmission layer 132.

In the present embodiment, in a direction from the cathode 14 to the organic light-emitting layer 131, since the concentration of the first doping agent 1321 in the third electron transmission layer 134 gradually decreases, it can effectively avoid the influence of the first doping agent 1321 on the organic light-emitting layer 131, thus preventing the alkaline earth metal elements or rare earth metal elements in the first doping agent 1321 from absorbing the photons generated by the organic light-emitting layer 131.

In addition, since the third electron transmission layer 134 is doped with the first doping agent 1321, the barrier of the electron carrier injecting from the first electron transmission layer 132 to the third electron transmission layer 134 decreases, which is beneficial to the jumping of the electrons. Moreover, during the jumping process of the electrons from the cathode 14 to the organic light-emitting layer 131, an energy level gradient and a doping gradient are formed, so that the electrons do not need to jump to high energy level, so as to avoid the electrons from being accumulated at the interface, which is beneficial to the injection of the electrons, and the response speed of the organic light-emitting component is increased.

It is apparent that, since the third electron transmission layer 134 is closer to the organic light-emitting layer 131 than the first electron transmission layer 132 is, the concentration of the first doping agent 1321 in the third electron transmission layer 134 shall not be higher than the concentration of the first doping agent 1321 in the first electron transmission layer 132.

Further, in an embodiment, as shown in FIG. 6, the doping concentration of the first doping agent 1321 at a side of the third electron transmission layer 134 close to the first electron transmission layer 132 is larger than the doping concentration of the first doping agent 1321 at a side of the third electron transmission layer 134 away from the first electron transmission layer 132. That is to say, since the concentration of the first doping agent 1321 in the first electron transmission layer 132 is relatively large, the first doping agent 1321 will disperse to the third electron transmission layer 134, so that the concentration of the side of the third electron transmission layer 134 close to the first electron transmission layer 132 is relatively high.

Furthermore, in another embodiment, the material of the electron transmission matrix in the third electron transmission layer 134 is the same as the material of the electron transmission matrix in the first electron transmission layer 132. For example, the material of the electron transmission matrix in the third electron transmission layer 134 can be dipyridyl, triazine ring, lithium quinoline, so as to improve the migration efficiency and the injection efficiency of the electron carrier.

Alternatively, the material of the electron transmission matrix in the third electron transmission layer 134 is the same as the material of the electron transmission matrix in the second electron transmission layer 133. For example, the material of the electron transmission matrix in the third electron transmission layer 134 can be carbazole material, thiophene material, scepter material or spiro material etc, so that the mobility of the hole carrier can be inhibited, thereby preventing the electron carrier and the hole carrier from being recombined at the third electron transmission layer 134 due to accumulation.

Figure 7:
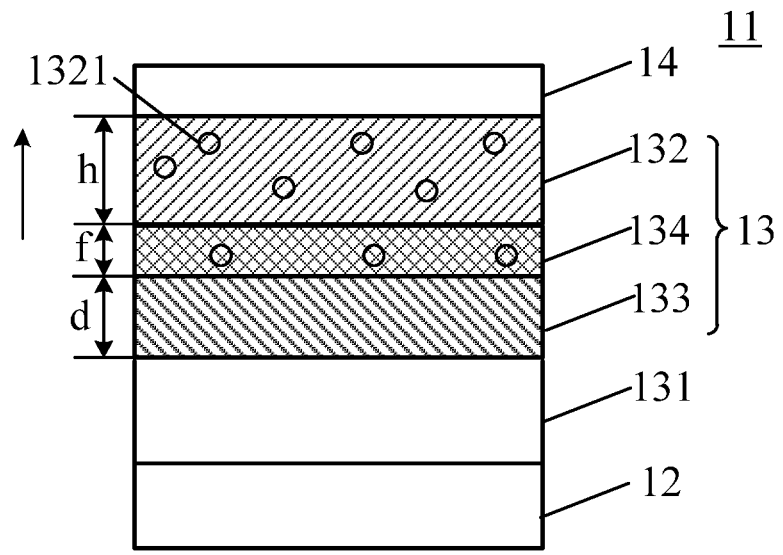
FIG. 7 illustrates still another cross-sectional view of the organic light-emitting component in FIG. 2 along AA' line according to an embodiment of the present disclosure.

Furthermore, in another embodiment, as shown in FIG. 7, FIG. 7 illustrates still another cross-sectional view of the organic light-emitting component in FIG. 2 along AA' line according to an embodiment of the present disclosure. In a direction (the direction shown by the arrow in FIG. 7) perpendicular to the organic light-emitting display panel 1, the thickness d of the second electron transmission layer 133 is larger than a thickness f of the third electron transmission layer 134. After the thickness of film layer of the organic light-emitting component 11 is met, since the second electron transmission layer 133 contacts with the organic light-emitting layer 131, that is, the second electron transmission layer 133 is closer to the organic light-emitting layer 131 than the third electron transmission layer 134 is. Therefore, when the thickness d of the second electron transmission layer 133 is larger than the thickness f of the third electron transmission layer 134, the influence of the first doping agent 1321 in the third electron transmission layer 134 on the organic light-emitting layer 131 can be further avoided, thereby guaranteeing the luminous efficiency.

In an embodiment, for example, the first doping agent 1321 can include at least one of alkaline earth metal Mg and Ga, or the first doping agent 1321 can include at least one of rare metal lanthanide series such as Yb, Sm and Tm, or the first doping agent 1321 can include at least one of rare earth metal Y, Gd and Lu.

Since the first doping agent 1321 includes at least one of Mg, Ga, Yb, Sm, Tm, Y, Gd and Lu, the first electron transmission layer 132 and the third electron transmission layer 134 containing the first doping agent 1321 can effectively improve the migration efficiency and injection efficiency of the electron carrier, thereby improving the luminous effect of the organic light-emitting display panel 1.

Further, in an embodiment, the first doping agent 1321 is an alkaline earth metal monomer, or a rare earth metal monomer. That is to say, the first doping agent 1321 doped in the first electron transmission layer 132 and the third electron transmission layer 134 can exist in a form of metal monomer.

Further, in another embodiment, the first doping agent 1321 can be a metal compound. That is to say, the first doping agent 1321 doped in the first electron transmission layer 132 and the third electron transmission layer 134 can exist in a form of metal compound. For example, the metal compound can be metal oxide such as magnesium oxide or calcium oxide; or the metal compound can be metal halide such as lithium fluoride; or the metal compound can also be metal complex such as lithium quinoline.

It should be supplemented that, no matter which form does the first doping agent 1321 exist in the first electron transmission layer 132 and the third electron transmission layer 134, the mobility of the electron carrier can be increased and the injection barrier of the electron carrier can be reduced.

Figure 8:
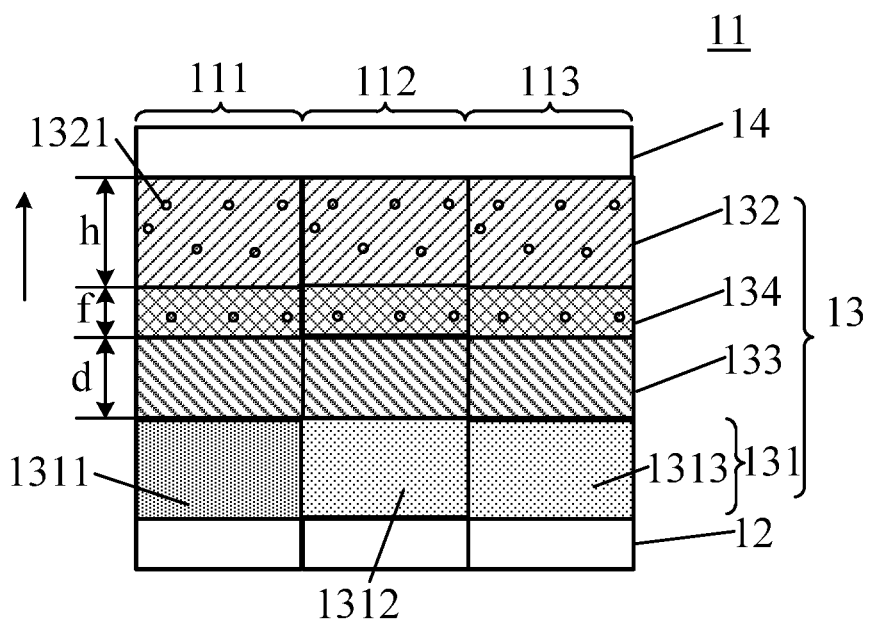
FIG. 8 illustrates another schematic structural diagram of an organic light-emitting display panel according to an embodiment of the present disclosure.

The organic light-emitting display panel 1 in the present embodiment can have m emergent light colors, m is an integer greater than or equal to 3. For example, as shown in FIG. 8, FIG. 8 illustrates another schematic structural diagram of an organic light-emitting display panel according to an embodiment of the present disclosure. The organic light-emitting components 11 include organic light-emitting components 111 emitting red light, organic light-emitting components 112 emitting green light and organic light-emitting components 113 emitting blue light. Since different emergent light colors correspond to different organic light-emitting layers, the highest occupied molecular orbital of the host materials of different organic light-emitting layers and the electron transmission matrix in the second electron transmission layer have the following relation:

In an embodiment, as shown in FIG. 8, the highest occupied molecular orbital HOMO31 of the host material in the red light-emitting layer 1311 of the red light-emitting component 111 and the highest occupied molecular orbital HOMO2 of the electron transmission matrix in the second electron transmission layer 133 satisfy: 0.2 eV<|HOMO2−HOMO31|<1 eV.

With reference to the above embodiments, it is known that the second electron transmission layer 133 can be interpreted as a hole blocking layer, after the highest occupied molecular orbital HOMO2 of the electron transmission matrix in the hole block layer and the highest occupied molecular orbital HOMO31 of the host material in the red light-emitting layer 1311 of the red light-emitting component 111 satisfy the above relation, it is beneficial for the electron of the red light-emitting molecular to jump to the excited state and release energy to emit red light. It should be noted that, in the present embodiment, it is preferred that 0.2 eV<|HOMO2−HOMO31|<0.3 eV, so as to better achieve the function of blocking hole migration and facilitating electron migration.

In an embodiment, as shown in FIG. 8, the highest occupied molecular orbital HOMO32 of the host material in the green light-emitting layer 1312 of the green light-emitting component 112 and the highest occupied molecular orbital HOMO2 of the electron transmission matrix in the second electron transmission layer 133 satisfy: |HOMO2−HOMO32|<1 eV.

With reference to the above embodiments, it is known that the second electron transmission layer 133 can be interpreted as a hole blocking layer, and after the highest occupied molecular orbital HOMO2 of the electron transmission matrix in the hole block layer and the highest occupied molecular orbital HOMO31 of the host material in the green light-emitting layer 1312 of the green light-emitting component 112 satisfy the above relation, it is beneficial for the electron of the green light-emitting molecular to jump to the excited state and release energy to emit green light.

In another embodiment, as shown in FIG. 8, the highest occupied molecular orbital HOMO33 of the host material in the blue light-emitting layer 1313 of the blue light-emitting component 113 and the highest occupied molecular orbital HOMO2 of the electron transmission matrix in the second electron transmission layer 133 satisfy: |HOMO2−HOMO33|<0.95 eV.

With reference to the above embodiments, it is known that the second electron transmission layer 133 can be interpreted as a hole blocking layer, and after the highest occupied molecular orbital HOMO2 of the electron transmission matrix in the hole block layer and the highest occupied molecular orbital HOMO33 of the host material in the blue light-emitting layer 1313 of the blue light-emitting component 112 satisfy the above relation, it is beneficial for the electron of the blue light-emitting molecular to jump to the excited state and release energy to emit blue light.

Figure 9:
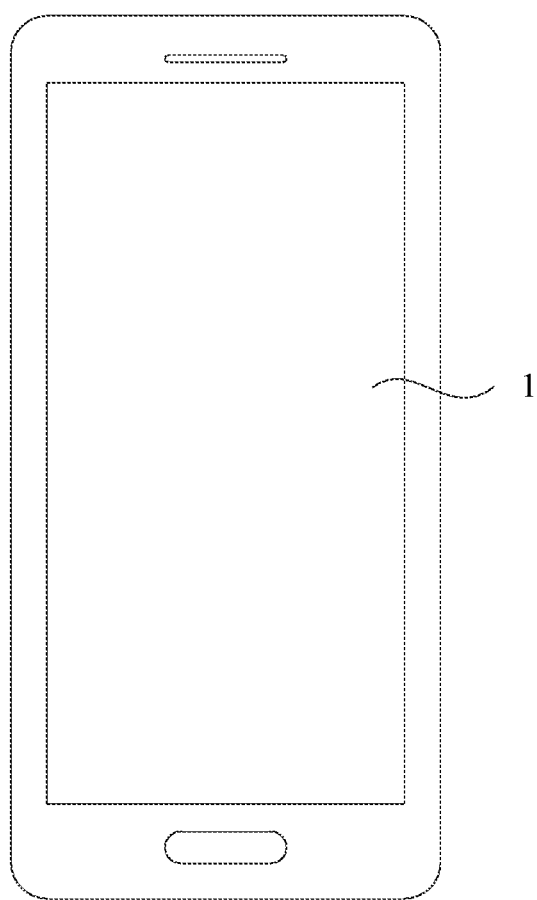
FIG. 9 illustrates a schematic structural diagram of an organic light-emitting display device according to an embodiment of the present disclosure.

An embodiment of the present disclosure provides an organic light-emitting display device, as shown in FIG. 9. FIG. 9 illustrates a schematic structural diagram of an organic light-emitting display device according to an embodiment of the present disclosure. The organic light-emitting display device 500 includes any one of the above organic light-emitting display panels 1. It should be noted that, although a cellphone is taken as an example in FIG. 9, the organic light-emitting display device is not limited to cellphone. The organic light-emitting display device can include but not limited to electronic devices having display function such as personal computer (PC), personal digital assistant (PDA), wireless handhold device, tablet computer, MP4 player or television and the like.

In the present disclosure the organic light-emitting display device 500 includes the above organic light-emitting display panel 1, therefore the organic light-emitting display device can achieve all the beneficial effects that the above organic light-emitting display panel 1 can achieve. That is, the first electron transmission layer is arranged between the cathode and the organic light-emitting layer, the first electron transmission layer includes the first doping agent, and the first doping agent includes alkaline earth metal elements or rare earth metal elements. Therefore the mobility of the electrons generated by the cathode migrating to the organic light-emitting layer can be increased. Moreover, a second electron transmission layer is arranged between the first electron transmission layer and the organic light-emitting layer. Since the second electron transmission layer does not contain the first doping agent, it will not absorb the photons generated by the recombination of the electrons and the holes, so that the luminous efficiency of the organic light-emitting display panel can be guaranteed. Further, when a negative voltage is applied to the cathode, the electrons overcome the potential barrier and are migrated towards lower energy level until they are migrated to the organic light-emitting layer. In the present embodiment, the lowest unoccupied molecular orbital LUMO1 of the electron transmission matrix in the first electron transmission layer and the lowest unoccupied molecular orbital LUMO2 of the electron transmission matrix in the second electron transmission layer satisfy: |LUMO2−LUMO2|<0.18 eV, the lowest unoccupied orbital energy level difference therebetween is small. Since the electron carriers are migrated to the organic light-emitting layer, the mobility of the electron is improved. In this case, some holes may also overcome the potential barrier and be migrated towards high energy level. In the present embodiment, the highest occupied molecular orbital HOMO2 of the electron transmission matrix in the second electron transmission layer and the highest occupied molecular orbital HOMO3 of the host material of the organic light-emitting layer satisfy: |HOMO2−HOMO3|<1 eV, and in the red light and green light system, |HOMO2−HOMO3|>0.2 eV, so as to prevent the red light holes and green light holes from migrating from the light-emitting layer to the hole blocking layer, and inhibit the exitons in the red light, green light and blue light light-emitting layer from migrating to the hole transmission layer, thereby achieving the function of inhibiting the hole carrier from migrating from the cathode to the organic light-emitting layer and, at the same time, prevent the influence to the luminous efficiency due to the situation that the electron carrier is recombined with the hole carrier before reaching the organic light-emitting layer.

Finally, it should be noted that: the above embodiments are only used to illustrate the technical solutions of the present disclosure, rather than limiting; although the disclosure is illustrated in detail with reference to the above embodiments, person skilled in the art shall understand: they can still make modifications to the technical solutions recorded in the above embodiments, or make equivalent replacements to part or all of the technical features; however, these modifications or replacements will not let the essence of corresponding technical solutions depart from the scope of the technical solutions of the embodiments of the present disclosure.

What is claimed is:

1. An organic light-emitting display panel, comprising:
an array substrate comprising a plurality of driving elements;
a plurality of organic light-emitting components corresponding to the plurality of driving elements, wherein each of the plurality of organic light-emitting components comprises an anode, a cathode and an organic functional layer between the anode and the cathode, wherein the organic functional layer comprises an organic light-emitting layer and a first electron transmission layer between the cathode and the organic light-emitting layer, wherein the first electron transmission layer comprises a first doping agent, and the first doping agent contains an alkaline earth metal element or rare earth metal element,
wherein each of the plurality of organic light-emitting components further comprises a second electron transmission layer located between the first electron transmission layer and the organic light-emitting layer, and the second electron transmission layer is undoped with the first doping agent,
wherein a lowest unoccupied molecular orbital LUMO1 of an electron transmission matrix in the first electron transmission layer and a lowest unoccupied molecular orbital LUMO2 of an electron transmission matrix in the second electron transmission layer satisfy: |LUMO1−LUMO2|<0.18 eV,
wherein a highest occupied molecular orbital HOMO2 of the electron transmission matrix in the second electron transmission layer and a highest occupied molecular orbital HOMO3 of a host material of the organic light-emitting layer satisfy: |HOMO2−HOMO3|<1 eV,
wherein in at least one of the plurality of organic light-emitting components, the highest occupied molecular orbital HOMO2 of the electron transmission matrix in the second electron transmission layer and the highest occupied molecular orbital HOMO3 of the host material of the organic light-emitting layer satisfy: |HOMO2−HOMO3|>0.2 eV, and
wherein each of the plurality of organic light-emitting components further comprises a third electron transmission layer located between the first electron transmission layer and the second electron transmission layer, and a doping concentration of the first doping agent in the third electron transmission layer is less than a doping concentration of the first doping agent in the first electron transmission layer.

2. The organic light-emitting display panel according to claim 1, wherein a highest occupied molecular orbital HOMO1 of the electron transmission matrix in the first electron transmission layer and the highest occupied molecular orbital HOMO2 of the electron transmission matrix in the second electron transmission layer satisfy: 0 eV<|HOMO1−HOMO2|<0.8 eV.

3. The organic light-emitting display panel according to claim 1, wherein the lowest unoccupied molecular orbital LUMO2 of the electron transmission matrix in the second electron transmission layer and a lowest unoccupied molecular orbital LUMO3 of the host material of the organic light-emitting layer satisfy: |LUMO2−LUMO3|<0.8 eV.

4. The organic light-emitting display panel according to claim 1, wherein the second electron transmission layer has a thickness d in a range of 2 nm<d<60 nm.

5. The organic light-emitting display panel according to claim 1, wherein in a direction perpendicular to the organic light-emitting display panel, a thickness of the first electron transmission layer is larger than a thickness of the second electron transmission layer.

6. The organic light-emitting display panel according to claim 1, wherein a doping volume ratio of the first doping agent in the first electron transmission layer is in a range of 0.5%-7%.

7. The organic light-emitting display panel according to claim 1, wherein an electron mobility Em and a hole mobility Hm in the second electron transmission layer satisfy: Em>Hm*100.

8. The organic light-emitting display panel according to claim 1, wherein the electron transmission matrix in the second electron transmission layer is made of a same material as that of the electron transmission matrix in the first electron transmission layer.

9. The organic light-emitting display panel according to claim 1, wherein a material of the electron transmission matrix in the second electron transmission layer is different from a material of the electron transmission matrix in the first electron transmission layer.

10. The organic light-emitting display panel according to claim 1, wherein a doping concentration of the first doping agent at a side of the third electron transmission layer close to the first electron transmission layer is larger than a doping concentration of the first doping agent at a side of the third electron transmission layer away from the first electron transmission layer.

11. The organic light-emitting display panel according to claim 1, wherein an electron transmission matrix in the third electron transmission layer is made of a same material as that of the electron transmission matrix in the first electron transmission layer, or the electron transmission matrix in the third electron transmission layer is made of the same material as that of the electron transmission matrix in the second electron transmission layer.

12. The organic light-emitting display panel according to claim 1, wherein in a direction perpendicular to the organic light-emitting display panel, a thickness of the second electron transmission layer is larger than a thickness of the third electron transmission layer.

13. The organic light-emitting display panel according to claim 1, wherein the first doping agent comprises at least one element of Mg, Ga, Yb, Sm, Y, Tm, Gd, or Lu.

14. The organic light-emitting display panel according to claim 13, wherein the first doping agent is an alkaline earth metal monomer or rare earth metal monomer.

15. The organic light-emitting display panel according to claim 13, wherein the first doping agent is a metallic compound.

16. The organic light-emitting display panel according to claim 1, wherein the plurality of organic light-emitting components comprises a red light-emitting component, a green light-emitting component and a blue light-emitting component, and
wherein a highest occupied molecular orbital HOMO31 of a host material in a red light-emitting layer of the red light-emitting component and a highest occupied molecular orbital HOMO2 of the electron transmission matrix in the second electron transmission layer satisfy: 0.2 eV<|HOMO2−HOMO31|<1 eV.

17. The organic light-emitting display panel according to claim 16, wherein a highest occupied molecular orbital HOMO32 of a host material in a green light-emitting layer of the green light-emitting component and the highest occupied molecular orbital HOMO2 of the electron transmission matrix in the second electron transmission layer satisfy: 0.2 eV<|HOMO2−HOMO32|<1 eV.

18. The organic light-emitting display panel according to claim 16, wherein a highest occupied molecular orbital HOMO33 of a host material in a blue light-emitting layer of the blue light-emitting component and the highest occupied molecular orbital HOMO2 of the electron transmission matrix in the second electron transmission layer satisfy: |HOMO2−HOMO33|<0.95 eV.

19. An organic light-emitting display device, comprising the organic light-emitting display panel according to claim 1.

* * * * *